United States Patent [19]

Dorward et al.

[11] Patent Number: 5,463,641
[45] Date of Patent: Oct. 31, 1995

[54] TAILORED ERROR PROTECTION

[75] Inventors: Sean M. Dorward, Somerville; Nuggehally S. Jayant, Gillette; James D. Johnston, Warren; Schuyler R. Quackenbush, Westfield; Nambirajan Seshadri; Carl-Erik W. Sundberg, both of Chatham, all of N.J.

[73] Assignee: AT&T IPM Corp., Coral Gables, Fla.

[21] Appl. No.: 92,623

[22] Filed: Jul. 16, 1993

[51] Int. Cl.[6] .................................................. H03M 13/00
[52] U.S. Cl. .............................................. 371/374; 371/43
[58] Field of Search ............................ 371/30, 37.1, 37.4, 371/37.5, 41, 43

[56] References Cited

U.S. PATENT DOCUMENTS

| | | | |
|---|---|---|---|
| 4,063,038 | 12/1977 | Kaul et al. | 370/84 |
| 4,654,853 | 4/1987 | Moriyama et al. | 371/41 |
| 4,882,733 | 11/1989 | Tanner | 371/43 |
| 5,070,503 | 12/1991 | Shikakwa | 371/37.1 |
| 5,121,395 | 6/1992 | Millar | 371/39.1 |
| 5,122,875 | 6/1992 | Raychaudhuri et al. | 358/133 |
| 5,182,753 | 1/1993 | Dahlin et al. | 371/43 |
| 5,202,952 | 4/1993 | Gillick et al. | 395/2 |
| 5,230,003 | 7/1993 | Dent et al. | 371/43 |
| 5,247,579 | 9/1993 | Hardwick et al. | 381/40 |
| 5,287,374 | 2/1994 | Parr | 371/43 |
| 5,289,501 | 2/1994 | Seshadri et al. | 375/17 |

FOREIGN PATENT DOCUMENTS

| | | |
|---|---|---|
| 503859 | 8/1982 | European Pat. Off. . |
| 453642 | 10/1991 | European Pat. Off. . |
| 490552 | 6/1992 | European Pat. Off. . |
| 58417 | 9/1992 | European Pat. Off. . |
| 533491 | 3/1993 | European Pat. Off. . |
| 2137788 | 10/1984 | United Kingdom . |
| 8706368 | 10/1987 | WIPO . |
| 9312598 | 6/1993 | WIPO . |

OTHER PUBLICATIONS

J. Hagenauer et al., "The Performance of Rate-Compatible Punctured Convolutional Codes for Digital Mobile Radio," *IEEE Transactions on Communications*, vol. 38, No. 7, 966–980 (Jul. 1990).

R. V. Cox et al., "Subband Speech Coding and Matched Convolutional Channel Coding for Mobile Radio Channels," *IEEE Transactions on Signal Processing*, vol. 39, No. 8, 1717–1731 (Aug. 1991).

Advanced Hardware Architectures, Inc., "High Speed, Programmable, Reed–Solomon ECC Codecs," 1–16.

S. Lin et al., *Error Control Coding—Fundamentals and Applications*, 278–280, 533–536, Prentice-Hall, Inc. (1983).

H. Suda et al., "An Error Protected 16 kbit/s Voice Transmission for Land Mobile Radio Channel," *IEEE Journal on Selected Areas in Communications*, vol. 6, No. 2, 346–352 (Feb. 1988).

*Primary Examiner*—Stephen M. Baker
*Attorney, Agent, or Firm*—Thomas A. Restaino

[57] ABSTRACT

A method of tailored error protection coding is disclosed. An illustrative coding method according to the present invention concerns encoding a first signal and a second signal to provide error protection for the signals, wherein the first signal requires greater error protection than the second signal. According to the method, the first signal is encoded with a first error protection code. The encoded first signal is then combined with the second signal. The combination of the encoded first signal and the second signal is further encoded with a second error protection code to generate a combined error protected signal, wherein the first signal is coded with both the first and second error protection codes. A second embodiment concerns the use of separate coders which apply different error protection codes to two signals. The two encoded signals are then combined into a single signal.

18 Claims, 2 Drawing Sheets

TAILORED ERROR PROTECTION

FIELD OF THE INVENTION

This invention relates to communication systems for communicating a plurality of information signals over a channel and more particularly to error protection coding arrangements for use in such communication systems.

BACKGROUND OF THE INVENTION

A communications system comprises a transmitter coupled to a receiver via a communication channel. The system functions to send and receive information signals. In the course of communicating information signals through the channel, such signals may be corrupted by channel noise and other error sources (e.g., fading) associated with the channel. In a digital communication system, these error sources may be responsible for, among other things, altering the content of the information received. To help prevent such error sources from corrupting received information signals, any of a number of channel coding techniques may be utilized in system transmitter and receiver design.

Generally, a channel coding technique helps mitigate the effects of error sources by introducing so-called "redundancy" to the information to be communicated. Because of this redundancy, the likelihood that noise will corrupt communicated information is reduced. Some communication errors may be completely eliminated.

Some communication systems transmit more than one information signal over a single channel. This may be accomplished with use of a conventional multiplexer combining individual information signals into a combined signal for transmission over the channel. To mitigate the effects of channel error sources on the communication of the combined information signal, a channel coder is applied to the combined signal. The coded result may then be provided to, for example, a conventional interleaver to help reduce the effects of fading.

The use of a single channel coder for a combined information signal can adequately guard against channel errors, but it can also be wasteful of bandwidth. This is because each of the individual information signals which form the combined information signal may have its own distinct level of robustness to channel errors.

For example, an audio signal and a separate information signal representing alphanumeric characters may be multiplexed into a combined information signal for transmission over a radio channel. Such an audio signal might be Beethoven's 5th symphony, while the alphanumeric signal might identify or advertise (in advance) the transmission of music to be played, to wit, "Beethoven's 5th Symphony." Such an advertisement might be displayed to an interested listener.

Channel errors which :result from transmission of such a combined signal can manifest themselves differently in each received component signal. A channel error affecting the audio portion of the combined information signal might manifest itself as an almost inaudible click, 5pop, or momentary signal drop-out. Such a channel error may not be very bothersome or even noticeable, for that matter, to a listener of the audio program. Moreover, the system receiver may be able to take any one of several possible remedial actions to mitigate the effects of such errors on the audio signal. In these ways, the audio signal may be thought of as "robust" to channel errors.

However, the alphanumeric signal is not nearly so robust. In fact, when channel errors affect the alphanumeric information signal, the result can be more nearly catastrophic. This is because unlike errors in the audio portion of the combined signal, errors in the alphanumeric signal may manifest themselves in a fashion which cannot be remedied or ignored, to wit, "Bejth6oen*s 17h Sym9hehy."

Thus, it may be appropriate to provide channel coding on the combined signal sufficient to protect the alphanumeric component. However, such degree of coding would also be applied to the audio component of the signal—a degree of coding unnecessary to protect the audio signal from the effects of channel errors. This "overcoding" of the audio component is wasteful of channel bandwidth since signal redundancy provided by channel coding "costs" bandwidth which might be used for other purposes.

SUMMARY OF THE INVENTION

The present invention provides tailored protection against channel errors in communication systems which transmit combined information signals associated with different degrees of error robustness.

According to an illustrative embodiment of the present invention, a first information signal having a corresponding first level of error robustness is provided to a first channel coder. The first channel coder applies a first channel code to the first information signal and provides its coded output to a multiplexer. A second information signal having a corresponding second level of error robustness (the second level being greater than the first level) is also provided to the multiplexer. The multiplexer combines its two input signals and outputs the combined signal to a second channel coder. The second channel coder applies a second channel code to the combined signal.

The level of error protection provided by the second channel coder is sufficient to mitigate the effects of channel errors on the second information signal; the second channel coder provides only a portion of the level of error protection required for the first information signal. The first channel coder applies an additional level of error protection to the first information signal. The combined level of error protection given the first information signal suits system design goals for robustness to channel errors. As a result, a tailored amount of error protection is applied to the component information signals so as to more efficiently make use of available bandwidth.

An alternative embodiment of the present invention is comprises first and second channel coders which provide first and second levels of error protection to first and second information signals, respectively. The output signals of the first and second channel coders are then multiplexer together into a combined information signal for communication over the channel.

A further alternative embodiment includes a multiplexer for combining first and second information signals and a channel coder which applies distinct channel codes to the distinct first and second information signal components of the combined signal.

DETAILED DESCRIPTION

Figure 1:
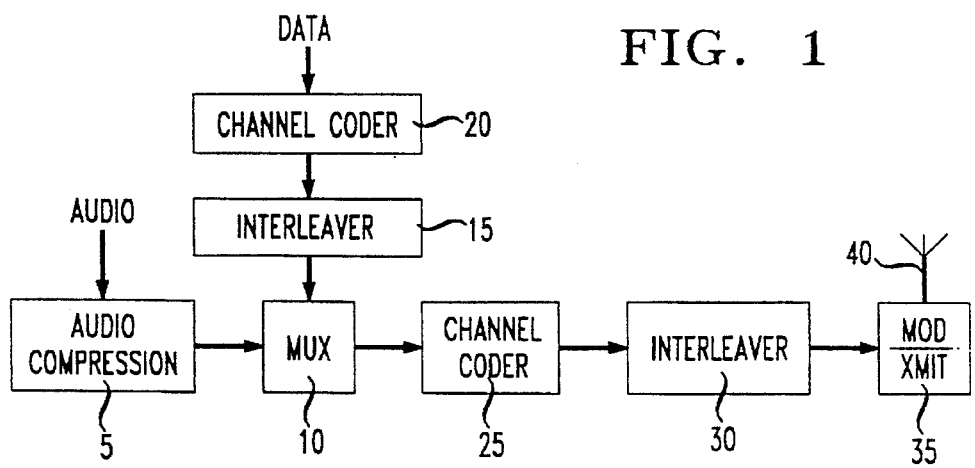
FIG. 1 presents a first illustrative embodiment of a digital audio broadcast system transmitter of separate audio and data signals.

FIG. 1 presents a first illustrative embodiment of a digital audio broadcast system transmitter of separate audio and data signals. The transmitter of FIG. 1 receives two information signals - audio and alphanumeric data, provides appropriate channel error protection for each signal, combines the signals into a single signal for transmission, and transmits a radio signal reflecting the combined signal. The transmitter of FIG. 1 comprises a channel coder 20 coupled to multiplexer (MUX) 10 via an interleaver 15; an audio compression system 5 also coupled to the MUX 10; a channel coder 25 coupled to the output of MUX 10; an interleaver 30 coupled to the output of channel coder 25; and a modulation and radio transmission system 35 coupled to the output of the interleaver 30 and a transmit antenna 40.

In accordance with the first illustrative transmitter of FIG. 1, the level of channel error protection required for the audio signal is less than the level of channel error protection required for the alphanumeric data. This difference in required levels of error protection is due to the relative nature of the two signals, as well as a receiver's ability to remediate channel errors in the audio signal. Therefore, the embodiment of FIG. 1 provides different levels of such protection to each such signal.

An audio signal is provided as input to the audio compression system 5. System 5 may be any system for the compression of either monophonic or stereo audio signals such as that system described in U.S. patent application Ser. Nos. 07/844,804; 07/844,819; 07/844,811 (all filed Mar. 2, 1992) and U.S. Pat. No. 5,227,788 (issued Jul. 13, 1993); the system described in U.S. application Ser. No. 07/844,966 (filed Feb. 28, 1992); or the system described in U.S. application Ser. No. 07/962,151 (filed Oct. 15, 1992), which are hereby incorporated by reference as if set forth fully herein. System 5 defines conventional timing and framing information for use by the transmitter of FIG. 1 and the receiver of FIG. 3. Compressed audio information signals are provided to conventional MUX 10. Alphanumeric data signals also for transmission are provided to channel coder 20. Channel coder 20 may comprise a conventional channel coder, such as a conventional Reed-Solomon coder or a binary block coder such as a BCH coder or a parity check coder. Channel coder 20 provides a first level of error protection for the data signals.

A coded data output signal is provided by coder 20 to conventional interleaver 15. Interleaver 15 scrambles the order of the received coder output signals to mitigate the effect of burst-like errors in channel decoding. Interleaver 15 can be a rectangular block interleaver matched to the channel coder 20 and channel coder 25.

Figure 2:
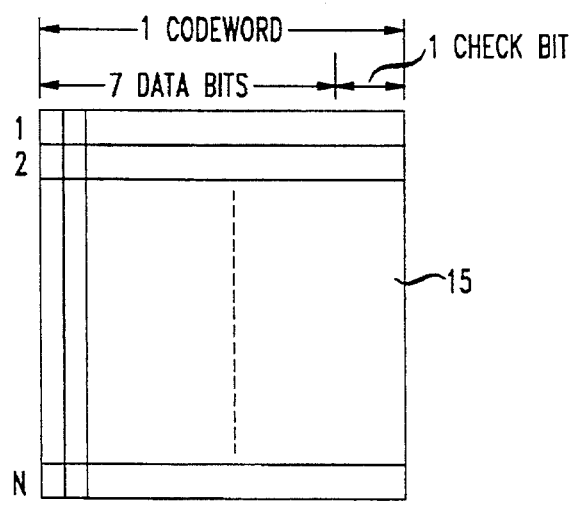
FIG. 2 presents a rectangular block interleaver for use in the embodiment of FIG. 1.

An illustrative interleaver 15 is presented in FIG. 2. As shown in the Figure, interleaver 15 is 8 bits wide to match an exemplary 8 bit parity check code applied by coder 20 (7 bits data, 1 bit parity check). Interleaver 15 is N bits in length, where N is at least as long as the information bit portion of the codeword used in channel coder 25. As is conventional in block interleavers, the codeword output from channel coder 20 is stored across the width of interleaver 15 (8 bits) and interleaver 15 output is read out along the length of the interleaver 15. The output of interleaver 15 is also provided to MUX 10. MUX 10 combines the audio and data signals into a single information signal for transmission.

The single information signal output from MUX 10 is then provided to a second channel coder 25. Channel coder 25, like channel coder 20, may be a conventional channel coder such as a Reed-Solomon coder. In the case of the data portion of the combined signal, channel coder 25 provides a second layer of channel coding. This second layer of coding provides additional error protection over and above what is afforded by the channel coding provided by coder 20. In the case of the audio signal component of the output of MUX 10, channel coder 25 provides the only layer of channel coding provided by the embodiment for that signal component. Thus, the channel coding provided by coder 25 is selected according to the need to provide error protection for the audio signal. Additional error protection required for the more error-sensitive alpha numeric data signal is provided by coder 20.

The output of coder 25 is provided to conventional interleaver 30. Interleaver 30 could be a rectangular block interleaver matched to channel code 25. Interleaver 30, like interleaver 15, scrambles the order of coder 25 output signals. In the case of interleaver 30, such scrambling mitigates against the effects of burst-like transmission channel fading.

The output of interleaver 30 is provided to conventional modulation and radio transmission circuitry 35. Circuitry 35 provides a signal for transmission via antenna 40 which reflects the output of interleaver 30, as well as additional conventional timing information used by the receiving radio circuitry.

In accordance with this first illustrative transmitter embodiment, channel coders 20 and 25 are selected to meet the error protection requirements of the radio system constraints for error protection. Data signals may receive a greater level of error protection by virtue of two layers of channel coding. Audio signals may receive less error protection by virtue of one layer of channel coding. Accordingly, channel bandwidth available for expenditure on channel coding/error protection of information signals is efficiently used.

Figure 3:
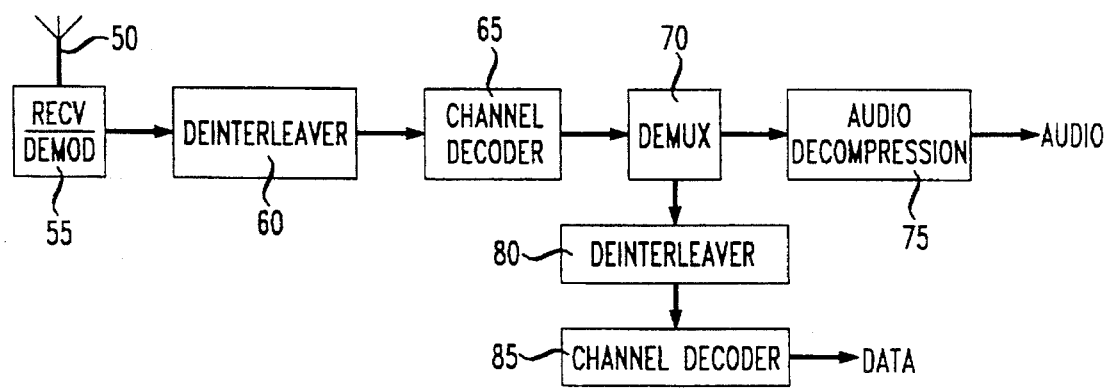
FIG. 3 presents a first illustrative embodiment of a digital audio broadcast system receiver of separate audio and data signals.

FIG. 3 presents a first illustrative embodiment of a digital audio broadcast system receiver of separate audio and data signals. The receiver of FIG. 3 may be used to receive signals transmitted by the illustrative embodiment of FIG. 1. The receiver comprises an antenna 50, conventional radio receiver and demodulation circuitry 55, a conventional deinterleaver 60 (which complements the operation of interleaver 30 of FIG. 1), a channel decoder 65 (which complements the operation of channel coder 25 of FIG. 1), a demultiplexer (DEMUX) 70 (which complements the operation of MUX 10 of FIG. 1), a conventional deinterleaver 80

(which complements the operation of interleaver 15 of FIG. 1), a channel decoder 85 (which complements the operation of channel coder 20 of FIG. 1), and an audio decompression system 75 (which complements the operation of system 5 of FIG. 1). DEMUX 70 separates audio and data portions of the combined signal responsive to conventional timing and framing signals extracted by receiver/demodulator 55 from the audio compression system 5 and transmit circuitry 35 in the transmitter of FIG. 1.

The channel decoders 65, 85 may be conventional Reed-Solomon or binary block code decoders corresponding to the encoders in FIG. 1. The channel decoder 65 provides an output flag when it fails to decode a codeword. This flag is utilized by an error mitigation/muting mechanism in the audio decompression system 75 and by the second decoder 85 for erasure correction. Such a flag will form part of channel decoder 65 output through DEMUX 70 to the audio decompression system 75 and interleaver 80 to channel decoder 85. The audio decompression system may be the complementary decompression system disclosed in the above-incorporated patents and applications.

Figure 4:
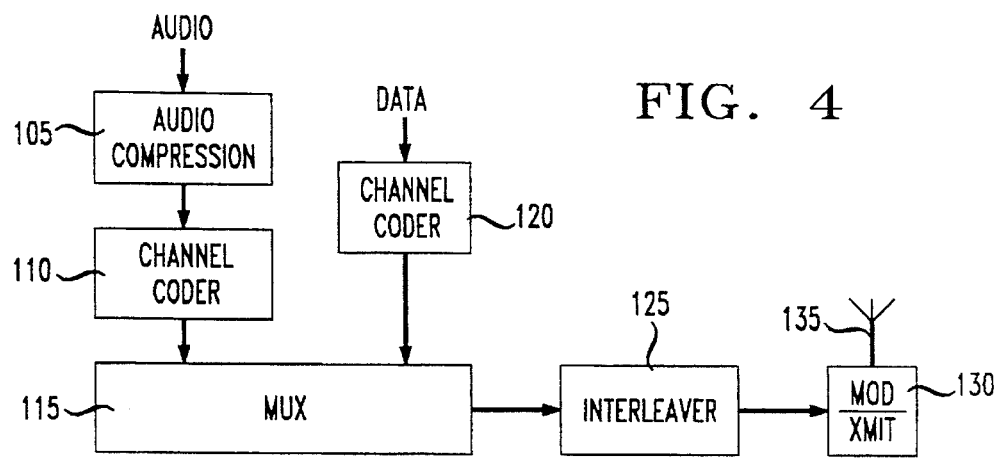
FIG. 4 presents a second illustrative embodiment of a digital audio broadcast system transmitter of separate audio and data signals.

FIG. 4 presents a second illustrative embodiment of a digital audio broadcast system transmitter of separate audio and data signals. The embodiment of FIG. 4 is similar to that of FIG. 1 in its use of an audio compression system 105 (which may be one of the types discussed above), conventional MUX 115, interleaver 125, and modulation/radio transmission circuitry 130. However, the embodiment of FIG. 4 differs from that of FIG. 1 in its placement and consequent use of channel coding 110, 120, and its use of a single interleaver.

In accordance with the operation of FIG. 4 (and FIG. 1), the audio information signal requires less error protection than does the alphanumeric data signal. The embodiment of FIG. 4 therefore provides separate conventional channel coders (of the types discussed above) which provide to the individual signals the requisite amount of error protection. Because the data signal is more sensitive to errors than the audio signal, channel coder 120 provides a relatively powerful channel code to the data signal. Channel coder 110 provides a comparatively less powerful code to the audio signal.

As with the first embodiment, the channel coders 110, 120 of the second illustrative transmitter embodiment are selected to meet the error protection requirements of the radio system. In this case, data signals receive a greater level of error protection by virtue a more powerful channel code than that applied to the audio signal. Such a more powerful code is not "wasted" (i.e., does not over-code) on the audio signal. Accordingly, channel bandwidth available for expenditure on channel coding/error protection of information signals is efficiently used. Timing and framing information is defined by system 105 and circuitry 130 for use by the transmitter of FIG. 4 and the receiver of FIG. 5.

The embodiment of FIG. 4 does not include a separate interleaver for the data signal prior to the MUX 115. This is because the only expected burst-like errors occurring prior to decoding are due to channel fading. Such errors may be mitigated by the use of interleaver 125 (and a complementary deinterleaver 155 in the receiver). Thus, no additional interleaving is necessary. The embodiment of FIG. 4 is expected to have lower transmission delay for the data than that in FIG. 1. This is due to the fact that the embodiment of FIG. 1 uses an extra interleaver.

Figure 5:
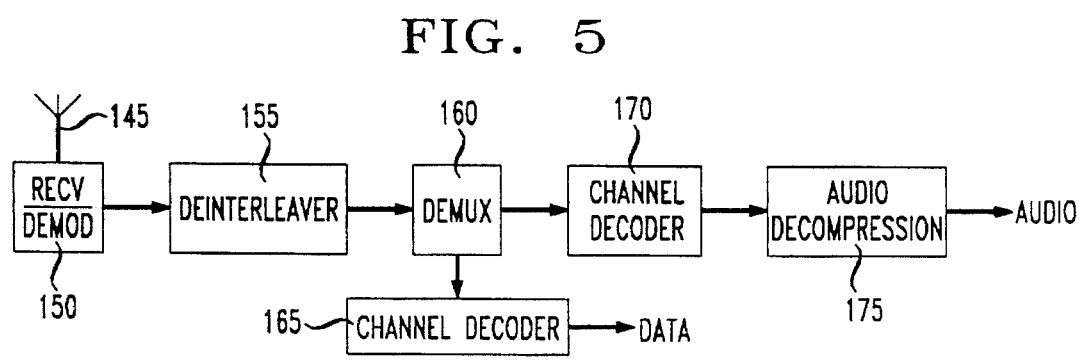
FIG. 5 presents a second illustrative embodiment of a digital audio broadcast system receiver of separate audio and data signals.

FIG. 5 presents a second illustrative embodiment of a digital audio broadcast system receiver of separate audio and data signals. This embodiment is complementary to that of FIG. 4. The receiver of FIG. 4 comprises an antenna 145, conventional radio receiver and demodulation circuitry 150, a conventional deinterleaver 155 (which complements the operation of interleaver 30 of FIG. 4), and a DEMUX 160 (which complements the operation of MUX 115 of FIG. 4). The embodiment further comprises a channel decoder 165 (which complements the operation of channel coder 120 of FIG. 4), a channel decoder 170 (which complements the operation of channel coder 110 of FIG. 4), and an audio decompression system 175 (which complements the operation of system 105 of FIG. 4). Timing and framing information needed by the receiver is extracted by circuitry 150 as is conventional. As discussed above, the channel decoders 165, 170 may be conventional Reed-Solomon or binary block decoders corresponding to the encoders in FIG. 4. The audio decompression system may be the complementary decompression system disclosed in the above-incorporated patents and applications.

Figure 6:
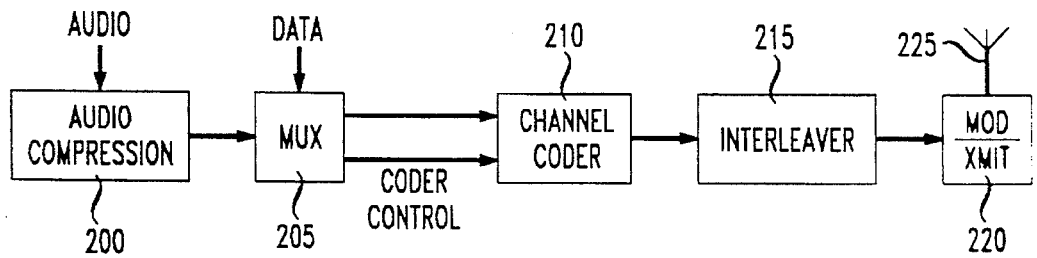
FIG. 6 presents a third illustrative embodiment of a digital audio broadcast system transmitter of separate audio and data signals.

FIG. 6 presents a third illustrative embodiment of a digital audio broadcast system transmitter of separate audio and data signals. The embodiment comprises an audio compression system 200 such as one of the types discussed above, a MUX 205 for combining data and coded audio signals into a single signal for transmission, a channel coder 210 for applying one of two available channel codes to the combined signal, a conventional interleaver 215, conventional modulation and radio transmission circuitry 220 and an antenna 225. System 200 provide timing and framing information for the use by the transmitter of FIG. 6 and the receiver of FIG. 7. Circuitry 220 provides additional timing information as is conventional.

The salient aspect of the third embodiment of FIG. 6 relative to the those of FIGS. 1 and 4 discussed above is the third embodiment's use of a single channel coder 210. Coder 210 applies one of two channel codes to the combined signal output from MUX 205 depending on whether coder 210 is to code the audio or data signal portion of the combined signal. These channel codes may be distinct, conventional Reed-Solomon or binary block channel codes. MUX 205 provides coder 210 with a control signal specifying the channel code to be used. The MUX 205 provides combined signal values in block sizes corresponding to the requirements of the particular coding techniques being implemented by coder 210.

MUX 205 provides blocks of information of length suitable for channel coder 210 to generate a complete codeword. These blocks will include either audio signals or data signals. Channel coder 210 advantageously provides codewords matched to interleaver 215 by providing the same matched codeword length for both audio and data signals.

As with the embodiments discussed above, the requirements for error protecting audio signals and alphanumeric data signals differ. Consequently, coder 210 implements a relatively powerful coding technique for data signal portions of the combined signal and a less powerful coding technique for audio signals.

Figure 7:
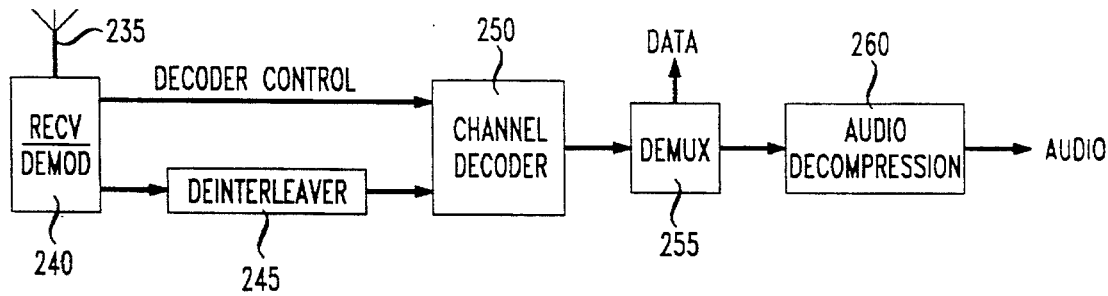
FIG. 7 presents a third illustrative embodiment of a digital audio broadcast system receiver of separate audio and data signals.

FIG. 7 presents a third illustrative embodiment of a digital audio broadcast system receiver of separate audio and data signals. The receiver of FIG. 7 comprises an antenna 235, conventional radio receiver and demodulation circuitry 240, and a conventional deinterleaver 245 (which complements the operation of interleaver 215 of FIG. 6). The embodiment further comprises a channel decoder 250 (which complements the operation of channel coder 210 of FIG. 6), a DEMUX 255 (which complements the operation of MUX 205 of FIG. 6), and an audio decompression system 260 (which complements the operation of system 200 of FIG. 6). The channel decoder 250 applies, e.g., one of two conventional Reed-Solomon decoding techniques corresponding to the encoding provided in FIG. 6 in accordance with timing information extracted by circuitry 240. The audio decompression system 260 may be one of those systems disclosed in the above-referenced patents and applications.

The embodiments discussed above have focused on two signals which are coded and combined. These two signals require different levels of error protection. While a two signal embodiment illustrates clearly the principles of the present invention, other embodiments may be provided which include a combination of more than two signals. In such embodiments, two or more signals require different levels of error protection.

Also, while the signals for coding are illustratively presented as conventional audio and alphanumeric data symbols, the signals are not constrained to these forms or categories. For example, the "audio" signal for coding may itself be a combination of an audio signal and a data signal.

The embodiments discussed above have focused on block codes. Other embodiments may be provided which use convolutional codes. In addition, while the embodiments discussed above use rectangular block interleavers, other embodiments may be provided which use other types of interleavers such as, for example, convolutional interleavers.

We claim:

1. A method for encoding a first signal and a second signal to provide error protection for the signals, the first signal requiring greater error protection than the second signal, the first and second signals for use in communication with a receiver, the receiver for producing decoded first and second signals corresponding to the first and second signals, respectively, the method comprising the steps of:
   a. encoding the first signal with a first error protection code;
   b. combining the encoded first signal with the second signal; and
   c. encoding a combination of the encoded first signal and the second signal with a second error protection code to generate a combined error protected signal for use in transmission to the receiver, wherein the first signal is coded with both the first and second error protection codes;

wherein said first signal is such that the decoded first signal, when irreparably corrupted due to transmission of said combined error protected signal, will not affect correct processing of the decoded second signal by the receiver.

2. The method of claim 1 where said first signal comprises alphanumeric data.

3. The method of claim 1 wherein the step of encoding the first signal comprises applying a Reed-Solomon error correction code to the first signal.

4. The method of claim 1 wherein the step of encoding the first signal comprises applying a binary block code to the first signal.

5. The method of claim 1 further comprising the step of interleaving the encoded first signal.

6. The method of claim 1 wherein the step of encoding the combination comprises applying a Reed-Solomon error correction code.

7. The method of claim 1 further comprising the steps of:
   compressing said audio signal in accordance with a model of human audio perception;
   applying an interleaver process to the encoded first signal;
   applying an interleaver process to the combined error protected signal; and
   transmitting a signal representing the combined error protected signal.

8. The method of claim 1 further comprising the step of applying an interleaver process to the combined error protected signal.

9. The method of claim 8 further comprising the step of transmitting a signal representing the combined error protected signal.

10. The method of claim 1 wherein said second signal comprises an audio signal.

11. The method of claim 10 further comprising the step of compressing said audio signal.

12. The method of claim 11 wherein the step of compressing is performed in accordance with a model of human audio perception.

13. A method for decoding a signal received by a receiver, the signal received representing a coded first signal and a coded second signal, wherein the coded first signal is based on a first signal coded with use of a first and a second error protection code and wherein the coded second signal is based on a second signal coded with use of the second error protection code, the first signal requiring greater error protection than the second signal, the method comprising the steps of:
   a. decoding the received signal with a first error protection decoder which corresponds to the first error protection code to generate a signal comprising a decoded second signal and a partially decoded first signal;
   b. separating the partially decoded first signal from the decoded second signal; and
   c. decoding the partially decoded first signal with a second error protection decoder which corresponds to the second error protection code to generate a decoded first signal, wherein the coded first signal is decoded with both the first and second error protection decoders;

wherein said first signal is such that the decoded first signal, when irreparably corrupted due to transmission, will not affect correct processing of the decoded second signal by the receiver.

14. The method of claim 13 further comprising the step of applying a deinterleaver process to the received signal.

15. The method of claim 13 further comprising the step of applying a deinterleaver process to the partially decoded first signal.

16. The method of claim 13 further comprising the step of applying an audio decompression system to the decoded second signal to generate a decompressed audio signal.

17. The method of claim 13 wherein the decoded first signal represents alphanumeric data.

18. The method of claim 13 further comprising the steps of:
   applying a deinterleaver process to the received signal;
   applying a deinterleaver process to the partially decoded first signal; and
   applying an audio decompression system to the decoded second signal to generate a decompressed audio signal.

* * * * *